(12) United States Patent
Weisberg

(10) Patent No.: US 7,368,228 B2
(45) Date of Patent: May 6, 2008

(54) MULTILAYER MEMS DEVICE AND METHOD OF MAKING SAME

(75) Inventor: Michael C. Weisberg, Woodside, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 663 days.

(21) Appl. No.: 10/742,276

(22) Filed: Dec. 19, 2003

(65) Prior Publication Data

US 2005/0136359 A1   Jun. 23, 2005

(51) Int. Cl.
 *G03F 7/00* (2006.01)
(52) U.S. Cl. .................. 430/320; 430/311; 430/322
(58) Field of Classification Search ............. 430/311, 430/322, 320
 See application file for complete search history.

(56) References Cited

U.S. PATENT DOCUMENTS 4,882,245 A * 11/1989 Gelorme et al. ............. 430/14
5,527,654 A *  6/1996 Benzing et al. ............. 430/143
6,582,890 B2 *  6/2003 Dentinger et al. .......... 430/322
6,794,119 B2 *  9/2004 Miles ......................... 430/313
6,861,205 B2 *  3/2005 Bowman et al. ............ 430/312

OTHER PUBLICATIONS

Advances in Abrasive Technology V, website pages from http://www.scientific.net/0-87849-910-5/19.htm, Nov. 7, 2003.
SU-8: A Thick Photo-Resist for MEMS, website pages from http://aveclafaux.freeservers.com/SU-8.html, Nov. 4, 2003.

* cited by examiner

*Primary Examiner*—Mark F. Huff
*Assistant Examiner*—Caleen O. Sullivan
(74) *Attorney, Agent, or Firm*—Fay Sharpe LLP

(57) ABSTRACT

A method of creating a microelectromechanical systems (MEMS) device includes applying a layer of photoresist to a lower layer to create a multilayer MEMS device. The method includes transferring the layer of photoresist to the lower layer. The method can also include spincoating the photoresist onto a release layer, softbaking the spincoated photoresist to at least partially dry it, transferring the photoresist to form a layer of the multilayer MEMS device, and exposing the photoresist to light to crosslink it. The multilayer MEMS device includes a plurality of layers of photoresist.

24 Claims, 4 Drawing Sheets

MULTILAYER MEMS DEVICE AND METHOD OF MAKING SAME

BACKGROUND

The present invention relates generally to the field of micro stereo lithography and more particularly to microelectromechanical systems (MEMS).

MEMS structures are very small machines and devices that are used for a wide variety of technical applications, including, but not limited to electrical, mechanical, and biological technologies. MEMS devices have become more common recently as the technology to build small multilayer devices has advanced.

Current processes for forming these devices include micro stereo lithography during which a layer of photoresist is applied to a substrate. Portions of the photoresist are then masked and the unmasked portions are exposed to light to crosslink them. The masked portions of the photoresist, which were not crosslinked, are then removed to create three dimensional structures in the single layer of photoresist. Multiple layers have not been applied to a substrate once the photoresist has been crosslinked. For example, applying another layer onto lower layers presents problems such as the photoresist filling spaces in the lower layers.

Using only a single layer significantly reduces the complexity of the MEMS device that can be fabricated in this manner. It is desirable to increase the complexity of MEMS devices.

Accordingly, it has been considered desirable to develop a new and improved process for developing MEMS structures which would overcome the foregoing difficulties and meet the above stated needs while providing better and more advantageous results.

BRIEF DESCRIPTION

A method of creating a MEMS device is provided.

In accordance with one aspect of the present invention the method includes applying a layer of photoresist onto a lower layer to form a multilayer MEMS device.

In accordance with a second aspect of the invention the applying step includes transferring the photoresist onto the lower layer.

In accordance with another aspect of the invention the method includes masking a portion of the photoresist leaving a portion of the photoresist unmasked, exposing the unmasked portion of the photoresist to light to crosslink the unmasked portion, removing the masked portion of the photoresist to create an open area in the layer, and repeating the steps of applying, masking, exposing, and removing to form multiple layers.

A multilayer MEMS device is provided.

In accordance with another aspect of the invention the multilayer MEMS device includes a substrate, and a plurality of layers of photoresist.

Other features, benefits and advantages of this invention will become apparent to those skilled in the art from the following detailed description of the preferred embodiments, when read in light of the accompanying drawings.

BRIEF DESCRIPTION OF THE DRAWINGS

The drawings are only for purposes of illustrating preferred embodiments and are not to be construed as limiting the invention. The invention may take form in various components and arrangements of components, and in various steps and arrangements of steps, preferred embodiments of which will be illustrated in the accompanying drawings wherein.

DETAILED DESCRIPTION

Figure 1:
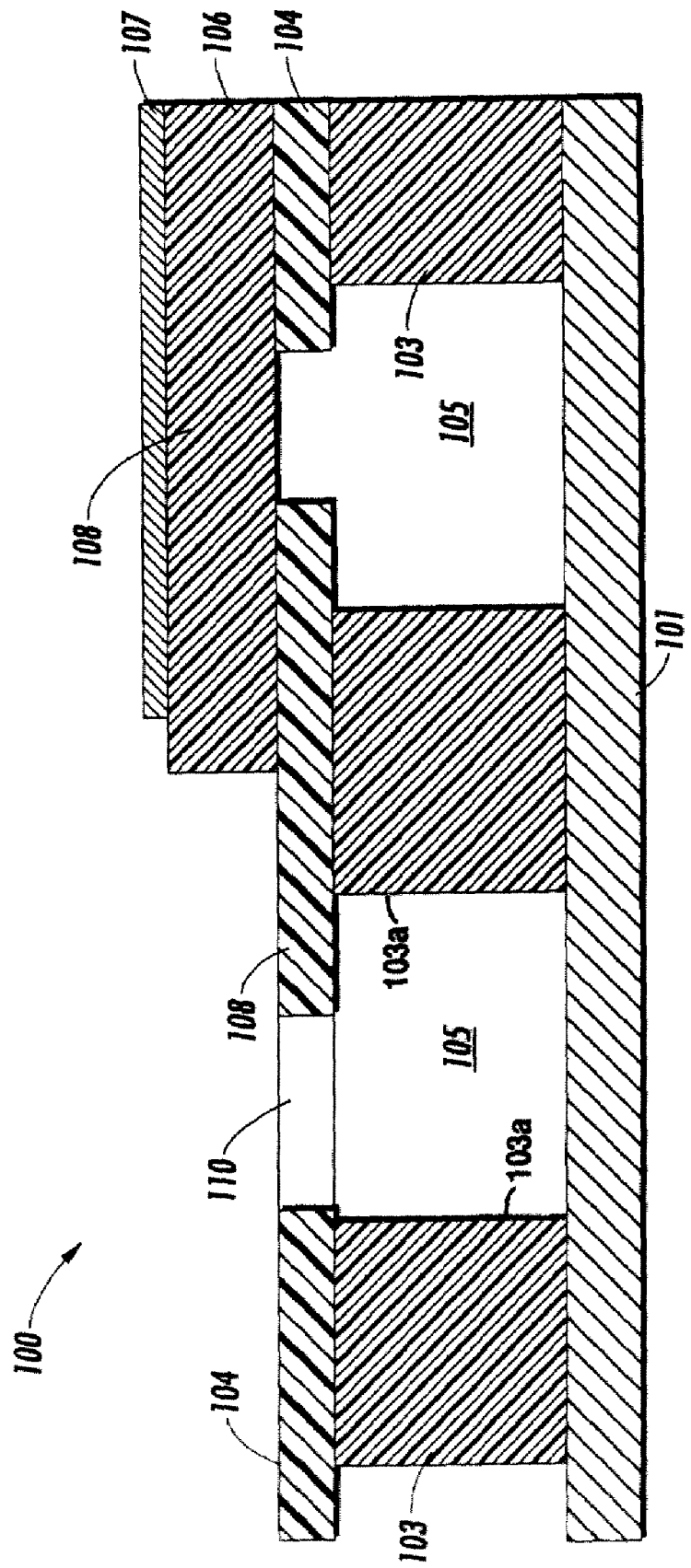
FIG. 1 is a cross-section of a multilayer MEMS device formed in accordance with the invention.

With reference to FIG. 1, a multilayer device, such a microelectromechanical system (MEMS) device is shown generally at 100. The device includes a substrate 101. The substrate is typically the base layer upon which the other layers of the multilayer device are formed as described below. Examples of the substrate can include, but are not limited to, silicon, glass, quartz, plastic, a polymer or any other suitable known substrate material.

The multilayer MEMS device 100 also includes multiple layers of crosslinked photoresist shown at 103, 104, and 106. The layers of photoresist 103, 104, and 106 include a layer 103 forming a lower layer with respect to the layers 104, and 106 above it, and a layer 104 forming an upper layer with respect to the layers 103 below it. The MEMS device 100 can include any suitable number of layers of photoresist, and one or more of the layers can have different configurations and/or different thicknesses.

The multilayer MEMS device 100 can also include one or more layers which are not a photoresist and not the substrate, one of which is shown at 107. Examples of materials used for these layers can include, but are not limited to, silicon, glass, quartz, ceramic, and metal among others. These layers can be applied in any suitable manner.

The multilayer MEMS device 100 can include one or more open areas 105 formed in a layer, such as the lower layer 103. The one or more open areas extending between spaced apart lower layer walls 103a as shown in FIG. 1. An open area 105 can be covered by an upper layer, such as layer 104 or layer 106, forming a bridge 108. Bridges 108 can be used to form passages and other three dimensional structures in the multilayer MEMS device 100. The invention provides the distinct advantage of enabling open areas, also known as channels, to bridged by an upper photoresist layer without sagging. For example, the invention enables open areas as wide as about 500 microns wide or wider to be bridged.

An open area 110 can be formed in a bridge 108 to create a passage between layers. The configuration created in this three-dimensional structure is dependant upon the application of the MEMS structure. Among the many applications where these multilayer MEMS devices 100 can be used include but are not limited to sensors, optoelectronic devices, mechanical devices and biological technologies.

At least one or more of the layers of the multilayer MEMS device 100 are formed of photoresist. The photoresist is a photo initiated resist material capable of being crosslinked by exposure to light, such as UV light. The photoresist can also be capable of being crosslinked and/or dried by heat to a rigid or semirigid. An example of the photoresist, which should not be considered limiting, includes the photoresist polymer called SU-8 developed by Shell Chemical, which shall be used in the examples provided herein. The SU-8 photoresist also has a low optical absorption resulting in reduced light scattering when exposed to light. This reduces the occurrence of rounded, sloped edges in device layers.

Figure 2:
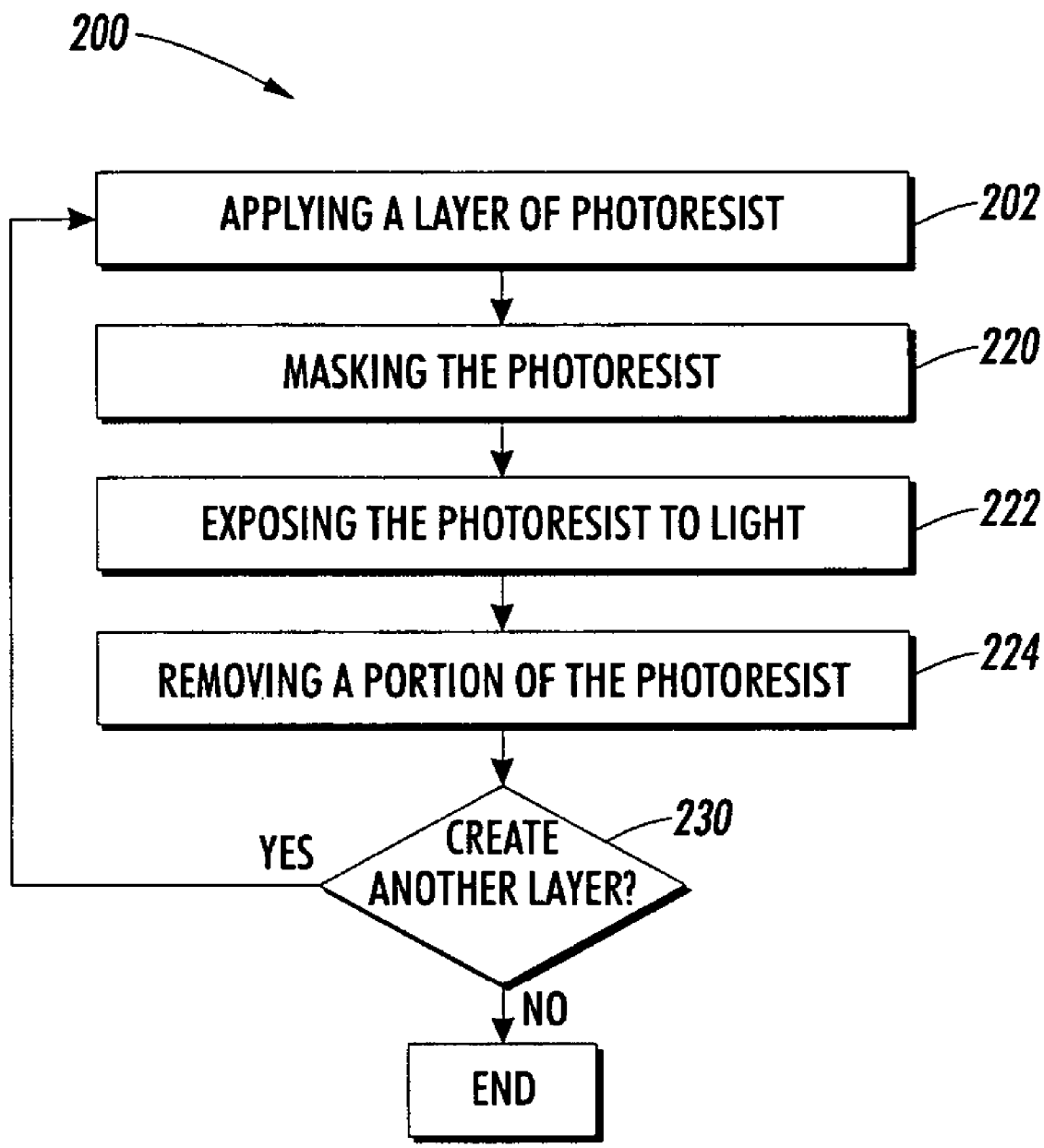
FIG. 2 is a flowchart illustrating the process for forming the multilayer MEMS device in accordance with the invention.

Referring now to FIG. 2, a flowchart illustrating a method for forming a multilayer MEMS device 100 is shown generally at 200. The method 200 includes applying a layer of the photoresist 104 to a lower layer 103 at 202. The lower layer 103 can be different than the substrate 101. The lower layer 103 can be a layer of photoresist. The lower layer 103 can be a layer which is not a photoresist and not the substrate, such as for example a layer of silicon, glass, quartz, ceramic, or metal, among others.

Figure 3:
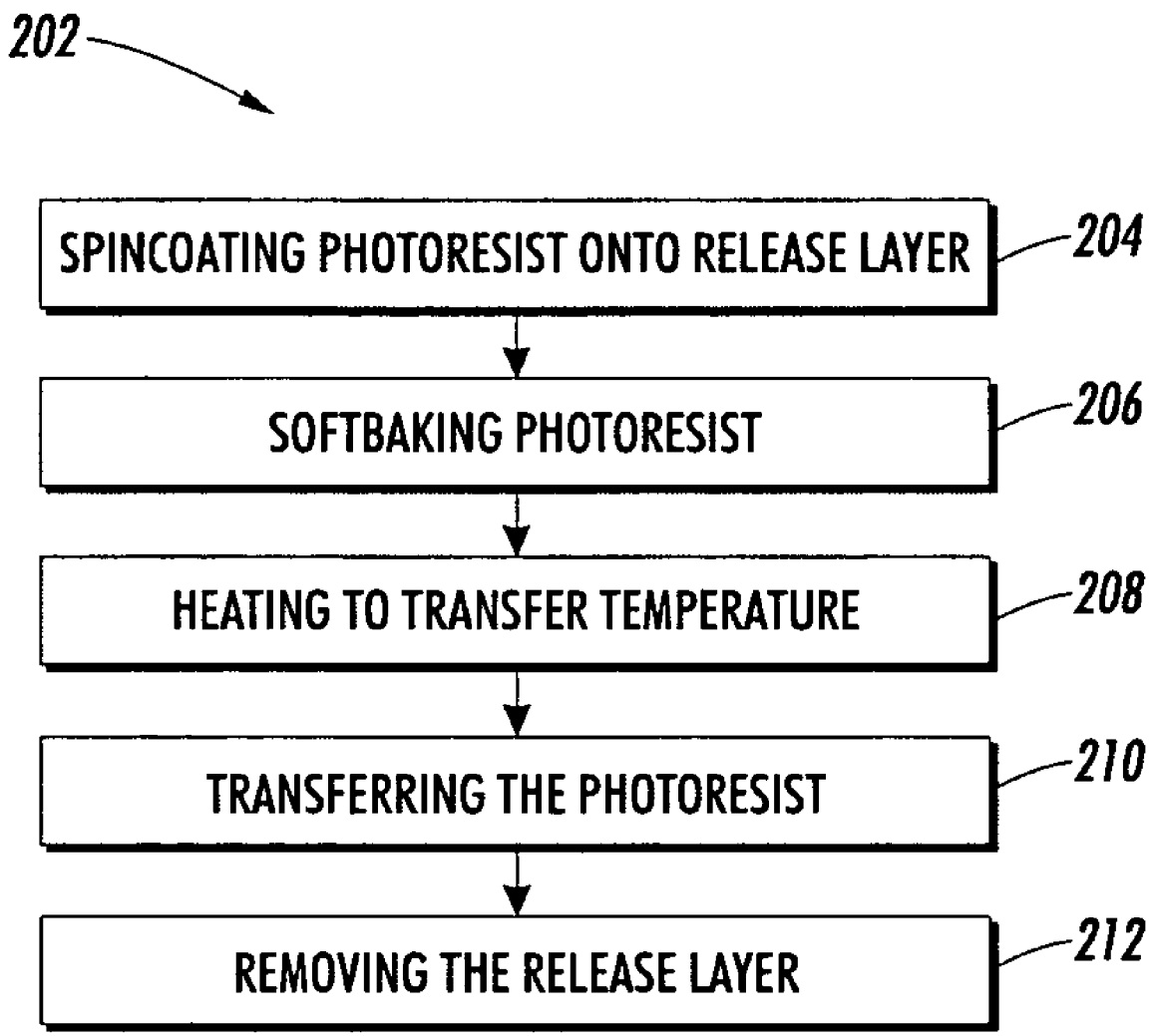
FIG. 3 is a flowchart illustrating the process for forming the multilayer MEMS device in accordance with the invention.
Figure 4:
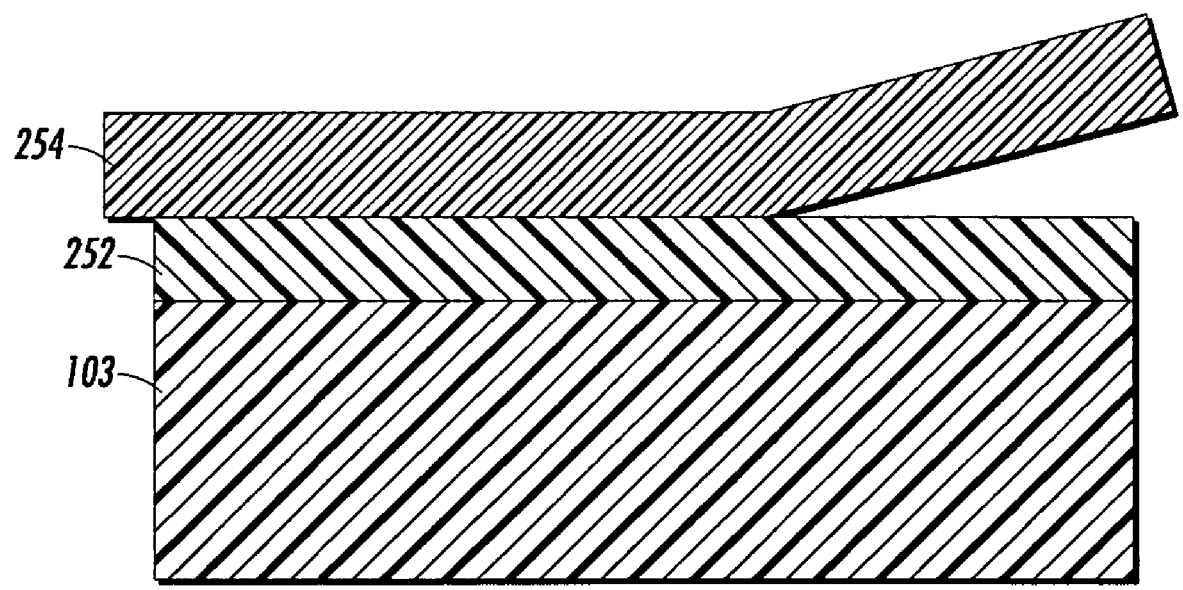
FIG. 4 is a cross-section of the MEMS device and release layer in accordance with the invention.

Referring now to FIGS. 3 and 4, the applying step 202 is shown in detail. The applying step 202 in FIG. 3 includes applying a layer of the photoresist shown as 252 in FIG. 4 to a release layer 254. The release layer 254 can be mylar, or any other suitable material. The photoresist 252 is preferably applied to the release layer wet. For example, the photoresist film 252 can be spincoated onto the release layer 254 at step 204 to form a film having the desired thickness.

The thickness of the photoresist film 252 can directly relate to the thickness of the layer it forms in the multilayer device. The thickness of the photoresist film 252 can be determined by using a predetermined amount of the wet photoresist with greater amounts forming a thicker film for a given area. The thickness of the photoresist film 252 can also be controlled by the speed of the spincoating step, with higher speeds producing thinner films and slower speeds producing thicker films.

Further, the thickness of the photoresist film 252 can be determined by the viscosity of the wet photoresist. It has been found that thicker films can be formed using photoresists having higher viscosities and thinner films with photoresists having lower viscosities. SU-8 photoresist is available in a wide range of viscosities which enables a wide range of photoresist film thicknesses to be formed.

The thickness of the layers can range anywhere from about 4 to about 100 microns thick or thicker depending on the application. The range of available layer thickness which can be formed enables the layers of the multilayer device 100 to bridging large open areas thereby forming complex devices.

The applying step 202 also includes drying the photoresist film until it is at least partially dry, such as at least partially dry to the touch at room temperature. The layer of photoresist can be softbaked on the release layer 254 at 206. The softbaking dries the photoresist film 252 by releasing solvents from the wet photoresist. Drying the photoresist layer, such as the softbaking step 206, leaves the photoresist material 252 in a rigid or semi-rigid state.

The thickness variation of the photoresist film 252 can be reduced by alternating the orientation of the release layer and photoresist film during softbaking. This can be done by placing the piece on a turntable within the oven and turning it. Turning the piece within the oven can reduce variations in thickness throughout the layer.

The applying step 202 also includes heating the substrate 101 and lower layer 103 at 208 to a transfer temperature to facilitate transferring the photoresist film 252 to the lower layer. It has been found that the substrate 101 should be heated to about 50 to 90 degrees Celsius to provide a good transfer.

The applying step 202 also includes transferring the photoresist film 252 to the lower layer at 210. It has been found that dry roll-transferring the photoresist 252 onto the lower layer is an effective way of applying the photoresist to a lower layer to form a multilayer MEMS device. The photoresist 252 is roll-transferred by placing the photoresist and release layer on to the substrate with the photoresist side against the lower layer and rolling the release layer to transfer the photoresist onto the lower layer. It has been found that heating the lower layer at 208 can improve the adhesion of the photoresist to the lower layer.

The applying step 202 further includes the step of removing the release layer 254 from the photoresist film 252 at 212. This can be performed easily by peeling the release layer from the photoresist. Since the photoresist 252 is applied to the substrate 101 dry or at least partially dry, the top of the photoresist 252 which was applied to the release layer is left very smooth after the transfer. Traditional wet applications of the photoresist onto a lower layer typically leave the surface rough, with an "orange peel" and they do not bridge open areas in the lower layer.

Once the photoresist 252 is applied to the lower layer, the device configuration of the layer is formed using photo lithography. The process 200 includes masking at least a portion of the photoresist at 220. The mask is applied to the top of the photoresist layer 103. The mask includes one or more sections covering the photoresist that do not allow light to pass through which form the masked portion and one or more sections covering the photoresist which do allow light to pass through which form unmasked portions. The masked and unmasked portions are determined based on the configuration requirements for this layer of photoresist in forming the multilayer device 100.

After the mask is applied to the photoresist, the process also includes exposing the photoresist 103 to light at 222 to crosslink the unmasked portions. Any suitable source for cross linking a photoresist, such as for example light of any suitable wavelength, for example ultraviolet (UV) light, can be used to crosslink the unmasked portions of the photoresist layer 103. Finally, the portions of the masked photoresist, which were not crosslinked by the light exposure are removed at 224. These portions can be removed by washing, such as washing with a solvent, or in any other suitable manner.

Multiple layers of photoresist can be formed by repeated the applying step 202, masking step 220, exposing step 222 and removing step 224 for each layer as shown at 230. The layers of the photoresist can be formed on top of lower layers of photoresist or other materials as described above to form the three dimensional structure of the multilayer device 100. The total device thickness variation can be reduced, to a variation of about +−2% by keeping the device stationary in the softbaking step and changing the orientation of the device by about 180 degrees for each successive layer.

One advantage of the invention includes forming a layer of photoresist on a lower layer to create a multilayer MEMS device. The invention enables the formation of a multilayer MEMS device having a complex three dimensional structure. The invention also provides the advantage of the layer of photoresist bridging one or more open areas in the lower layer. Each layer of photoresist can have a different thickness, and can be composed of a different configuration.

The exemplary embodiment has been described with reference to the preferred embodiments. Obviously, modifications and alterations will occur to others upon reading and understanding preceding detailed description. It is intended that the exemplary embodiment be construed as including all such modifications and alterations insofar as they come within the scope of the appended claims or the equivalents thereof.

The invention claimed is:

1. A method of creating a microelectromechanical systems (MEMS) device having a substrate and a lower layer comprising:
   creating a lower layer formed of a first material having spaced apart walls;
   applying a layer of photoresist onto the lower layer, the layer of photoresist including a bridge bridging an open area in the lower layer extending between the spaced apart walls;
   masking a portion of the photoresist leaving a portion of the photoresist unmasked;
   exposing the unmasked portion of the photoresist to light to crosslink the unmasked portion; and
   removing the masked portion of the photoresist to form a multilayer MEMS device having a layer of crosslinked photoresist on top of the lower layer with the bridge bridging the open area.

2. The method defined in claim 1, wherein the applying step comprises drying the photoresist.

3. The method defined in claim 2, wherein the applying step comprises dry roll transferring the layer of photoresist onto the lower layer.

4. The method defined in claim 1, wherein the applying step further comprises:
   spincoating the photoresist onto a release layer;
   softbaking the spincoated photoresist and transferring the layer of photoresist onto the lower layer from the release layer.

5. The method defined in claim 4, wherein the spincoating step includes spincoating the photoresist to a thickness of about 4 to about 100 microns thick.

6. The method defined in claim 4, wherein the applying step further comprises:
   heating the lower layer to a transfer temperature;
   transferring the photoresist onto the lower layer; and
   removing the release layer.

7. The method defined in claim 6, wherein the heating step includes heating the lower layer to about 50 to 90 degrees Celsius.

8. The method defined in claim 1, further comprising:
   repeating the steps of applying, masking, exposing, and removing to form multiple layers of photoresist.

9. The method defined in claim 1, wherein the layers of photoresist have different thicknesses.

10. The method defined in claim 1, wherein the layer of photoresist has a thickness variation of about +−13%.

11. The method defined in claim 1, wherein the MEMS device has a total device thickness variation of about +−2%.

12. The method defined in claim 1, wherein the lower layer is not a photoresist.

13. A method of creating a microelectromechanical systems (MEMS) device comprising:
   applying a layer of photoresist comprising:
      applying the photoresist wet onto a release layer, and
      transferring the photoresist from the release layer onto a layer of crosslinked photoresist having spaced apart walls and an open area extending between the spaced apart walls, the transferred photoresist bridging the open area;
   masking a portion of the photoresist leaving a portion of the photoresist unmasked;
   exposing the unmasked portion of the photoresist to light to crosslink the unmasked portion;
   removing the masked portion of the photoresist to create an open area in the layer; and
   repeating the steps of applying, masking, exposing, and removing to form multiple layers of crosslinked photoresist on top of each other and bridging open areas.

14. A method of creating a microelectromechanical systems (MEMS) device having a substrate and a lower layer comprising:
   applying a layer of photoresist onto a lower layer having spaced apart walls defining an open area extending between the spaced apart walls, the applied layer of photoresist having a bridge portion bridging the open area; and
   crosslinking the layer of photoresist to form a multilayer MEMS device having a layer of crosslinked photoresist on top of the lower layer with the bridge portion bridging the open area.

15. The method defined in claim 14, wherein the applying step comprises dry roll transferring the layer of photoresist onto the lower layer.

16. The method defined in claim 14, wherein the applying step further comprises:
   spincoating the photoresist onto a release layer;
   softbaking the spincoated photoresist and transferring the layer of photoresist onto the lower layer from the release layer.

17. The method defined in claim 16, wherein the spincoating step includes spincoating the photoresist to a thickness of about 4 to about 100 microns thick.

18. The method defined in claim 16, wherein the applying step further comprises:
   heating the lower layer to a transfer temperature of about 50 to 90 degrees Celsius;
   transferring the photoresist onto the lower layer; and
   removing the release layer.

19. The method defined in claim 1, wherein the lower layer is a photoresist.

20. The method defined in claim 1, wherein the open area is at least 500 microns wide.

21. The method defined in claim 1, further comprising forming an open area in the bridge to create a passage between layers.

22. The method defined in claim 14, further comprising forming an open area in the bridge portion to create a passage between layers.

23. The method defined in claim 13, wherein the open area is at least 500 microns wide.

24. The method defined in claim 14, wherein the open area is at least 500 microns wide.

* * * * *